United States Patent [19]

Sonnek

[11] Patent Number: 4,973,904
[45] Date of Patent: Nov. 27, 1990

[54] TEST CIRCUIT AND METHOD

[75] Inventor: Christopher D. Sonnek, North St. Paul, Minn.

[73] Assignee: NCR Corporation, Dayton, Ohio

[21] Appl. No.: 282,719

[22] Filed: Dec. 12, 1988

[51] Int. Cl.$^5$ .................. G01R 31/00; G01R 31/02
[52] U.S. Cl. .................. 324/158 R; 324/158 T; 307/474; 371/22.1
[58] Field of Search .......... 371/22; 324/73 R, 73 AT, 324/158 T, 73.1, 158 R

[56] References Cited

U.S. PATENT DOCUMENTS

| | | | |
|---|---|---|---|
| 4,490,673 | 12/1984 | Blum et al. | 324/158 R |
| 4,495,628 | 1/1985 | Zasio | 377/70 |
| 4,503,387 | 3/1985 | Rutledge et al. | 324/73 R |
| 4,544,882 | 10/1985 | Flora | 324/73 R |
| 4,546,472 | 10/1985 | Volk et al. | 371/27 |
| 4,587,480 | 5/1986 | Zasio | 324/73 R |
| 4,612,499 | 9/1986 | Andersen et al. | 324/73 R |
| 4,631,474 | 12/1986 | Dolland | 324/73 R |
| 4,631,724 | 12/1986 | Shimizu | 371/21 |
| 4,644,265 | 2/1987 | Davidson et al. | 324/158 R |
| 4,674,089 | 6/1987 | Poret et al. | 371/25 |
| 4,698,588 | 10/1987 | Hwang et al. | 324/158 R |
| 4,701,920 | 10/1987 | Resnick et al. | 371/25 |
| 4,701,922 | 10/1987 | Kuboki et al. | 324/73 R |
| 4,782,283 | 11/1988 | Zasio | 324/158 R |
| 4,833,395 | 5/1989 | Sasaki et al. | 324/73 R |

*Primary Examiner*—Reinhard J. Eisenzopf
*Assistant Examiner*—William J. Burns
*Attorney, Agent, or Firm*—Wilbert Hawk, Jr.; Stephen F. Jewett; Jack R. Penrod

[57] ABSTRACT

A test circuit for the output buffer of an integrated circuit permits testing for faults in the electrical connection of the output buffer to external conductors on a printed circuit board and for faults in the output buffer itself. A tester device supplies two test control signals to the test circuit for causing the output of the output buffer to be forced high, to be forced low, to pass the logic level of the internal data signal provided to the input of the output buffer, or to go into a tri-state (high impedance) condition.

8 Claims, 2 Drawing Sheets

TEST CIRCUIT AND METHOD

Background of the Invention

The present invention relates to the testing of electrical circuits and, more particularly, to the testing of integrated circuit chips mounted on a printed circuit board (PCB).

Many processes are known for testing complex digital circuits, such as very large scale integration (VLSI) circuit chips. One problem often encountered in testing such chips and not fully addressed by known testing processes is the problem of properly testing the input-/output (I/O) circuits of the chips and their connection to external conductors, such as the conductors of a printed circuit board (PCB) on which the chips are mounted.

In-circuit test devices are commercially available for testing VLSI circuits mounted on PCBs. Such devices are typically programmed with "models" of the components mounted on a board. Nodes on the board are toggled "high" and "low" by the test device to simulate the signals that are provided to the components and board connections during actual circuit operation. If expected signal responses are not received, and if the components are known to be good, then the problem can often be traced to a faulty connection between the components and the board.

The model of each component on the board that must be programmed into the test device will often take considerable time and programming resources. This obviously leads to greater cost in the final production of the board. Furthermore, the toggling of nodes on the board during testing forces current into the nodes and causes any component outputs connected to the nodes to be "backdriven" (i.e., current to be forced in a reverse direction into the output) which in turn leads to excessive heat being generated in the components.

There has thus arisen the need for a device and method for testing I/O circuits and their connections to conductors on a printed circuit board, without having to create software models of the components on the board and without backdriving the components.

SUMMARY OF THE INVENTION

There is provided, in accordance with the present invention, a test circuit for the output buffer of an integrated circuit chip. The output buffer receives an internal data out signal from circuitry within the chip and provides at its output a buffered data out signal that is passed to an external conductor, such as a conductor formed on a PCB. The test circuit includes a test input for receiving an external test signal and a logic circuit which causes the buffered data out signal to go to a predetermined logic level in response to the test signal. The predetermined level of the buffered data out signal is used to test the electrical connection of the integrated circuit to the conductors on the PCB, such as by use of a tester device to determine if the predetermined signal level is present on the PCB conductor to which the output buffer is electrically connected.

In one described embodiment, the output buffer includes two NMOS transistors. During normal, non-test mode of operation, one of the NMOS transistors receives at its gate the inverse of the signal received at the gate of the other transistor. In accordance with the present invention, a test circuit at the output buffer receives: (1) two test control bits, and (2) an internal data bit that in the non-test mode is to be passed to the output of the buffer. The test control bits can represent four signal conditions. In one condition, both test control bits are at "0" and the output buffer passes the logic level represented by the internal data bit. In a second condition, a first control bit is at "0" and the other is at a "1", and the output buffer will provide a "1" regardless of the level of the internal data bit. In a third condition, the first control bit is at a "1" and the other is at a "0", and the output buffer will provide a "0" regardless of the level of the internal data bit. In the fourth condition, both test control bits are at a "1" and the output buffer is in a tri-state, high impedance condition at its output.

In a second described embodiment, the output buffer includes a CMOS inverter, with the test circuit also receiving two test control bits and an internal data bit. The test control bits have the same four conditions as described in connection with the first embodiment above.

It is therefore an object of the present invention to provide a new and improved test circuit and method for an integrated circuit.

It is another object of the present invention to provide such a circuit and method for testing the electrical connections of an integrated circuit to external conductors, such as those on a printed circuit board.

It is yet another object of the present invention to provide a test circuit and method as described above that permits testing for faulty electrical connection of an integrated circuit to a printed circuit board without the necessity of creating program models of the components mounted on the printed circuit board.

It is still a further object of the present invention to provide a test circuit and method wherein "backdriving" of components on a printed circuit board is minimized.

These and other objects, features, and advantages of the present invention will become apparent from the following description and the attached drawings, wherein like reference numbers indicate like parts.

DETAILED DESCRIPTION OF THE PREFERRED EMBODIMENTS

Figure 1:
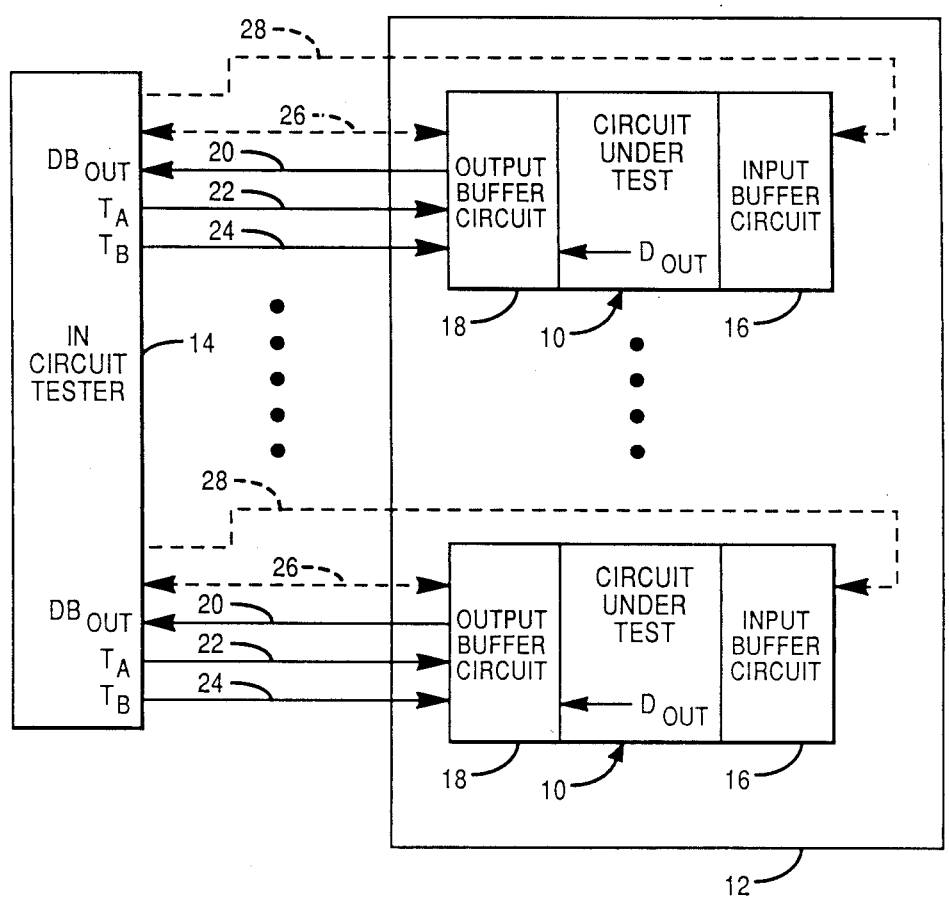
FIG. 1 is a simplified block diagram illustrating the testing of an integrated circuit mounted on a printed circuit board, the integrated circuit having an output buffer with a test circuit in accordance with the present invention.

Referring now to FIG. 1, there is seen a plurality of integrated circuits 10 mounted on a printed circuit board (PCB) 12. As indicated in FIG. 1, each integrated circuit 10 is, in the arrangement illustrated, a "circuit under test", i.e., a circuit being tested for faults by an in-circuit tester 14.

The in-circuit tester 14 is a conventional test device having probes that are electrically connected to various nodes on the PCB 12 or to input/output pads on the integrated circuit 10, for the purpose of providing certain test control bits or signals (illustrated as $T_A$ and $T_B$ in FIG. 1) and receiving back certain data signals (illustrated as $DB_{OUT}$ in FIG. 1) and comparing those signals in order to isolate faults. A commercially available test device that can be used in the arrangement illustrated in FIG. 1 is the GENRAD 2272 In-Circuit Tester from GenRad, Inc., Concord, Mass.

Each integrated circuit 10 includes an input buffer circuit 16 and an output buffer circuit 18 for buffering the various signals that during normal operation will be received by the circuit 10 from, and provided by circuit 10 to, conductors (not shown in the drawings) on the PCB 12. Although the present invention is primarily concerned with the detection of faults in the output buffer circuit 18 and in the electrical connection of the output buffer circuit to the conductors on the PCB 12, in the arrangement seen in FIG. 1 the in-circuit tester 14 can also be used to isolate faults elsewhere in the integrated circuit 10 and on the PCB 12. The tester 14 is illustrated in FIG. 1 as receiving a buffered data out signal $DB_{OUT}$ (from each buffer in the output buffer circuit 18) over a probe line 20, and for providing two test control signals $T_A$ and $T_B$ to the output buffer circuit over probe lines 22 and 24.

Each buffer in the output buffer circuit 18 has a test circuit (to be described later in connection with FIGS. 3 and 5) which receives the test signals $T_A$ and $T_B$ in order to generate a predetermined signal level as the buffered data out signal $DB_{OUT}$. The test signals thus permit testing of the electrical connection between the integrated circuit and the conductor on the PCB 12 receiving the data out signal $DB_{OUT}$, by using the tester 14 to check whether the signal level on that conductor is the same as the predetermined signal level generated by the output buffer in response to the test signals $T_A$ and $T_B$. The test signals also permit testing of the components within the output buffer circuit 18 itself, by using the tester 14 to check whether the output buffer circuit provides the proper predetermined signals in response to the test signals. When the electrical connection of the integrated circuit 10 to the conductor on the PCB 12 is being tested, the probe from the tester on line 20 is connected to the conductor; when components of the output buffer circuit itself are being tested, the probe can be directly connected to the input/output pad on the integrated circuit which provides the buffered data out signal $DB_{OUT}$.

The integrated circuit 10 is also seen in FIG. 1 as having an internal data out signal $D_{OUT}$, which is the data signal being passed through one of the buffers in the buffer circuit 18 to the conductor on the PCB 12 when the circuit 10 is in normal operation (not being tested). Also, it should be obvious that although only a single set of probe lines 20, 22, and 24 is illustrated, there are a large number of output pads on the integrated circuit 10, each providing a signal from one buffer in the output buffer circuit 18 to a corresponding conductor on the PCB 12, and each connected to a probe line in order to accomplish testing of the electrical connection to its corresponding conductor and testing of its corresponding components in the output buffer circuit 18. All the additional probe lines so required are indicated collectively by the dashed line 26 in FIG. 1. In the preferred embodiment, there are dedicated input pads on the integrated circuit 10 that are used exclusively for receiving the test signals $T_A$ and $T_B$. In order to minimize the number of such pads, the buffers in the output buffer circuit 18 can have their test inputs tied together so they all receive the same two test signals $T_A$ and $T_B$, and thus only two test input pads (and only the two probe lines 22 and 24) would be required for providing test signals to all of the buffers in the output buffer circuit 18.

Finally in connection with FIG. 1, the tester 14 will provide other testing of the integrated circuit 10 which is not part of the present invention, but which could be done in a well known manner by providing certain input test signals to the PCB 12. These test signals are illustrated as provided by probe lines indicated collectively by dashed line 28. Among other things, the test signals provided to the input buffer circuit 16 might be used to generate a specific signal level for each buffered data out signal $DB_{OUT}$, by using programmed models of the components in circuit 10 to determine what data signals need to be provided to the input buffer circuit (as the test signals over line 28) to generate the specific level for $DB_{OUT}$. Tester 14 checks the signal $DB_{OUT}$ to see if it has the expected signal level.

Figure 2:
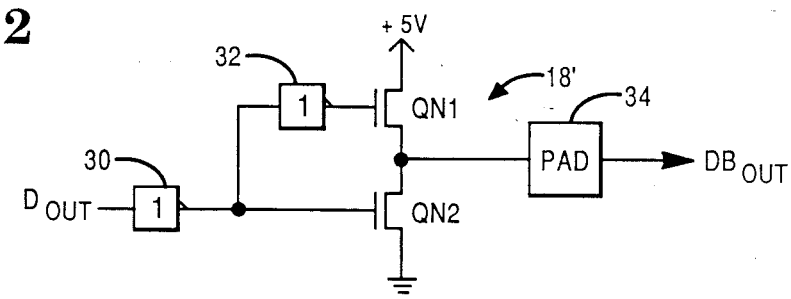
FIG. 2 is a schematic circuit diagram of an output buffer having two NMOS output transistors, such output buffer not having the test circuit of the present invention.

To aid in understanding the present invention, FIG. 2 shows a single output buffer 18' without a test circuit. The output buffer 18' has two inverters 30 and 32, and two NMOS transistors QN1 and QN2. The drain of QN1 is connected to a +5 V source and the source of QN1 is connected to the drain of QN2 and to the data output pad 34 of the buffer. The source of QN2 is connected to ground. The internal data signal $D_{OUT}$ is provided to the inverter 30, which has its output connected to the gate of QN1 by way of the inverter 32 and directly to the gate of QN2. When $D_{OUT}$ is at a "0", QN2 is enabled (QN1 is disabled) and the signal $DB_{OUT}$ provided at the output of the buffer 18' to the pad 34 goes to ground or "0". When $D_{OUT}$ is at "1", QN1 is enabled (QN2 is disabled) and the signal $DB_{OUT}$ goes to "1".

Figure 3:
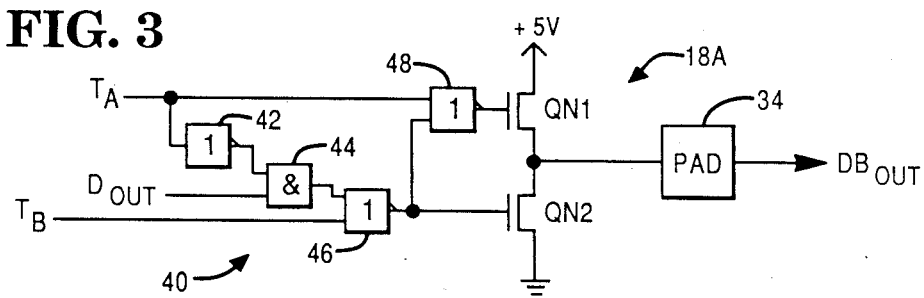
FIG. 3 is a schematic circuit diagram of an output buffer having two NMOS output transistors, such output buffer having a test circuit and illustrating one embodiment of the present invention.

In FIG. 3 there is illustrated one output buffer 18A of the output buffer circuit 18 of FIG. 1 (there would be an output buffer 18A corresponding to each bit at the output of the integrated circuit 10). The buffer 18A operates similarly to the output buffer 18' of FIG. 2, but further includes a test circuit 40 in accordance with the present invention. Test circuit 40 has logic circuitry including an inverter 42, an AND gate 44, and NOR gates 46 and 48. Test circuit 40 has an input for receiving the internal data out signal $D_{OUT}$, and not only performs during normal (non-test) operation the logic function of the inverters 30 and 32 of FIG. 2, but also has test inputs for receiving the two test signals $T_A$ and $T_B$ in order to accomplish testing. The two bits that constitute the test signals $T_A$ and $T_B$ have four possible binary combinations (or conditions) which control the logic level of the buffered data out signal $DB_{OUT}$ as shown in the following Table:

TABLE

| $T_A$ | $T_B$ | $D_{OUT}$ | $DB_{OUT}$ | CONDITION |
|---|---|---|---|---|
| 0 | 0 | 0 | 0 | Normal Operation |
| 0 | 0 | 1 | 1 | Normal Operation |
| 0 | 1 | 0 | 1 | Force High ("1") |
| 0 | 1 | 1 | 1 | Force High ("1") |
| 1 | 0 | 0 | 0 | Force Low ("0") |
| 1 | 0 | 1 | 0 | Force Low ("0") |
| 1 | 1 | 0 | Z | Tri-State |
| 1 | 1 | 1 | Z | Tri-State |

Z = High Impedance

Referring back to FIG. 1, it should be noted that the tri-state condition seen in the above Table is quite advantageous in the testing of the PCB 12 when there is more than one integrated circuit 10 on the PCB 12. When the input test signals are provided over the line 28 to the input buffer 16 of one integrated circuit, the output buffer circuit 18 of each of the other integrated circuits may be put in the tri-state condition to prevent the output buffer circuits from being "backdriven".

Figure 4:
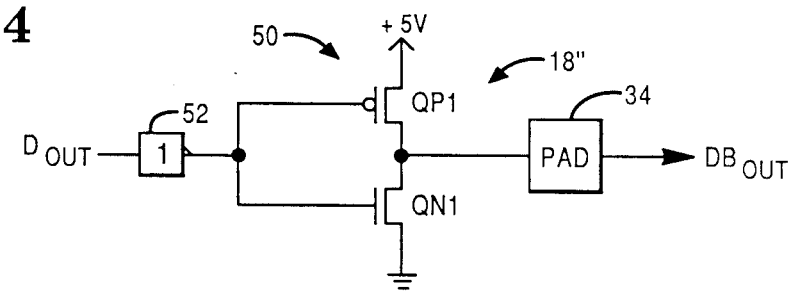
FIG. 4 is a schematic circuit diagram of an output buffer having a CMOS inverter, such output buffer not having the test circuit of the present invention.

In FIG. 4 there is shown an output buffer 18″ without the test circuit of the present invention, but having a CMOS inverter 50 (consisting of a PMOS transistor QP1 and an NMOS transistor QN1) rather than two NMOS transistors as in the output buffer 18′ of FIG. 2. Output buffer 18″ also includes an inverter 52 for receiving the internal data out signal $D_{OUT}$ so that, when $D_{OUT}$ is at a "1", QP1 is enabled (QN1 is disabled) and the signal $DB_{OUT}$ is at a "1", and when $D_{OUT}$ is at a "0", QN1 is enabled (QP1 is disabled) and $DB_{OUT}$ is at a "0".

Figure 5:
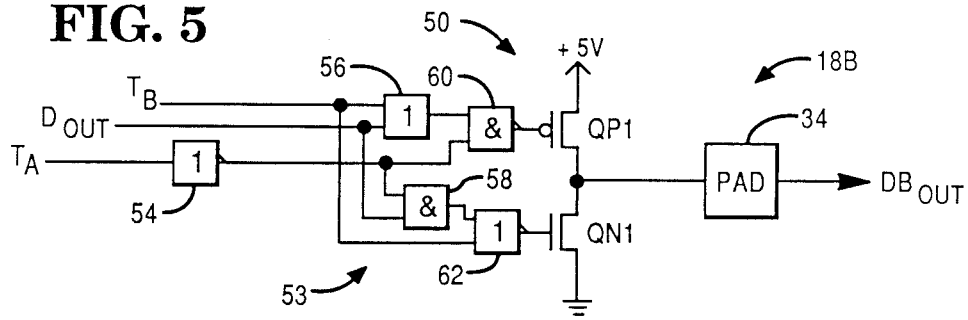
FIG. 5 is a schematic circuit diagram of an output buffer having a CMOS inverter, such output buffer having a test circuit and illustrating a second embodiment of the present invention.

In FIG. 5 there is shown, as an alternate embodiment of the present invention, an output buffer 18B similar to output buffer 18″ of FIG. 4, but including a test circuit 53. The output buffer 18B has a CMOS inverter 50 (consisting of PMOS transistor QP1 and NMOS transistor QN1). The test circuit 53 receives the internal data out signal $D_{OUT}$ and the test signals $T_A$ and $T_B$, and includes an inverter 54, an OR gate 56, an AND gate 58, a NAND gate 60, and a NOR gate 62. The truth table shown above for the output buffer 18A of FIG. 3 also applies to the output buffer 18B of FIG. 5.

As should be evident to one skilled in the art, there is no additional propagation delay for the signal $D_{OUT}$ in either buffer 18A or buffer 18B. The configuration of AND gate 44/NOR gate 46 in FIG. 3, and the configuration of OR gate 56/NAND gate 60 and AND gate 58/NOR gate 62 in FIG. 5 can easily be implemented with a single logic stage (since AND/OR combinations permit single logic stage implementation in NMOS and CMOS technologies).

While not shown in the drawings, it should be appreciated that the present invention can also be advantageously used in a bidirectional input/output buffer circuit. For example, the circuitry seen in FIGS. 3 or 5 could be used as the output buffers in such a bidirectional buffer circuit. When the input buffers are driving the input/output pad, the output buffers could be put in the tri-state condition to more effectively isolate and prevent backdriving of the output buffers in the buffer circuit.

It can thus be seen that there has been provided by the present invention a test circuit for the output buffer of an integrated circuit which permits the testing of electrical connections to external conductors and the testing of the components in the output buffer, and which may be put in a tri-state condition to prevent backdriving during testing.

Although the presently preferred embodiments of the invention have been described, it will be understood that various changes may be made within the scope of the appended claims.

What is claimed is:

1. A test circuit for the output buffer of an integrated circuit, the output buffer receiving an internal output signal and providing in response a buffered output signal to be passed to an external conductor connected to said integrated circuit, said test circuit comprising:
   a test input for receiving two external test signals; and
   a logic circuit connected to said test input and causing, in response to only said two test signals, the buffered output signal of the output buffer to have one of four selectable conditions at its output, said four conditions comprising:
   the first logic level;
   the second logic level;
   the logic level of the internal output signal received by the output buffer; and
   a high impedance;
   whereby the buffered output signal having the selected output condition is passed to the external conductor connected to the integrated circuit in order to test the electrical connection of the integrated circuit to the external conductor.

2. The test circuit of claim 1, wherein the output buffer has two output transistors, with one of said output transistors enabled to cause the buffered output signal to have said first logic level and with the other of the output transistors enabled to cause the buffered output signal to have said second logic level.

3. The test circuit of claim 2, wherein said two output transistors are each NMOS transistors.

4. The test circuit of claim 3, wherein said logic circuit comprises:
   an inverter for receiving one of the two external test signals;
   an AND gate having a first input for receiving the output of said inverter and a second input for receiving the internal output signal;
   a first NOR gate having a first input for receiving the output of said AND gate and a second input for receiving the other of the two external test signals; and
   a second NOR gate having a first input for receiving the one of the two external test signals and a second input for receiving the output of said first NOR gate;
   wherein said one of said two output transistors is enabled by the output of said first NOR gate and said other of said two output transistors is enabled by the output of said second NOR gate.

5. The test circuit of claim 2, wherein said two output transistors are a CMOS inverter, comprising a PMOS transistor and a NMOS transistor.

6. The test circuit of claim 5, wherein said logic circuit comprises:
   an inverter for receiving one of the two external test signals;
   an OR gate having a first input for receiving the other of the two external test signals and a second input for receiving the internal output signal;
   an AND gate having a first input for receiving the output of said inverter and a second input for receiving the internal output signal;

a NAND gate having a first input for receiving the output of the OR gate and a second input for receiving the output of the inverter; and a NOR gate having a first input for receiving the output of the AND gate and a second input for receiving the other of the two external test signals;

wherein said PMOS transistor is enabled by the output of said NAND gate and said NMOS transistor is enabled by the output of said NOR gate.

7. A system for testing an output buffer of an integrated circuit connected to external conductors, said buffer having at least two transistors which provide, in response to a data out signal, a data buffer out signal which is passed to the external conductors, said system comprising:

a circuit tester device, including:

generating means for generating at least two test signals; and receiving means for receiving a signal on the external conductors for purposes of comparing that signal to a signal expected to be generated as the data buffer out signal in response to the two test signals;

a test circuit in said buffer for causing the data buffer out signal to have a predetermined logic level in response to the two test signals, said test circuit including:

first override means for causing the data buffer out signal to go to a first signal level in response to the test signals having first, predetermined logic levels, regardless of the logic level of the data out signal provided to the transistors;

second override means for causing the data buffer out signal to go to second signal level in response to the test signals having a second, predetermined logic levels, regardless of the logic level of the data out signal provided to the transistors;

disable means for disabling both transistors so that the output of the buffer circuit has a high impedance state; and enable means for enabling the transistors so that the buffer circuit provides the data buffer out signal in response to the data out signal, without being overridden by the first and second override means.

8. A method for testing the electrical connection of an integrated circuit to an external conductor, said integrated circuit having an output buffer for receiving an input signal at its input and providing in response an output signal at its output, said method comprising:

providing two test signals;

providing logic circuitry for driving, in response to only said two test signals, the output signal at the output of the buffer to have one of four selectable conditions, said four conditions comprising:

the first logic level;

the second logic level;

the logic level of the internal output signal received by the output buffer; and a high impedance; and then comparing the signal on the external conductor with the predetermined signal level of the output signal at the output of the output buffer, so that a lack of equality between the signal on the external conductor and the predetermined signal level indicates a faulty connection of the integrated circuit to the external conductor.

* * * * *